(12) United States Patent
Nair et al.

(10) Patent No.: US 10,234,496 B2
(45) Date of Patent: Mar. 19, 2019

(54) DETECTION OF VALVE OPEN TIME FOR SOLENOID OPERATED FUEL INJECTORS

(71) Applicant: Woodward, Inc., Fort Collins, CO (US)

(72) Inventors: Suraj Nair, Fort Collins, CO (US); Doyle Kent Stewart, Laport, CO (US)

(73) Assignee: Woodward, Inc., Fort Collins, CO (US)

( * ) Notice: Subject to any disclaimer, the term of this patent is extended or adjusted under 35 U.S.C. 154(b) by 455 days.

(21) Appl. No.: 15/044,985

(22) Filed: Feb. 16, 2016

(65) Prior Publication Data

US 2017/0234920 A1  Aug. 17, 2017

(51) Int. Cl.
*H01H 47/00* (2006.01)
*G01R 31/06* (2006.01)
*F02D 41/20* (2006.01)
*H01F 7/06* (2006.01)

(52) U.S. Cl.
CPC ............ *G01R 31/06* (2013.01); *F02D 41/20* (2013.01); *H01F 7/064* (2013.01); *F02D 2041/2024* (2013.01); *F02D 2041/2055* (2013.01); *F02D 2041/2058* (2013.01); *F02D 2041/2086* (2013.01)

(58) Field of Classification Search
USPC ........................................................ 361/139
See application file for complete search history.

(56) References Cited

U.S. PATENT DOCUMENTS

| 4,200,827 | A | * | 4/1980 | Oswald ............... G05B 19/232 318/561 |
| 5,053,911 | A | | 10/1991 | Kopec et al. |
| 5,086,743 | A | | 2/1992 | Hickey |
| 5,592,921 | A | | 1/1997 | Rehbichler |
| 5,600,237 | A | | 2/1997 | Nippert |
| 5,861,746 | A | | 1/1999 | Ensten |

(Continued)

FOREIGN PATENT DOCUMENTS

| DE | 4237706 A1 | 5/1994 |
| EP | 0400389 A2 | 12/1990 |

(Continued)

OTHER PUBLICATIONS

International Search Report and Written Opinion of the International Searching Authority issued in International Application No. PCT/US2017/016665 dated May 8, 2017; 12 pages.

*Primary Examiner* — Ronald W Leja
(74) *Attorney, Agent, or Firm* — Fish & Richardson P.C.

(57) ABSTRACT

The subject matter of this specification can be embodied in, among other things, a method that includes evaluating an analog electrical current waveform, determining a Boolean waveform based on the evaluated analog electrical current waveform, determining a collection of one or more first durations based on one or more on times identified from the Boolean waveform, determining a collection of one or more second durations based on one or more off times identified from the Boolean waveform, comparing the first durations and the second durations, determining, based on the comparing, an event based on the comparing, identifying a time at which the event occurred, and providing the time as a completion time.

20 Claims, 4 Drawing Sheets

(56) References Cited

U.S. PATENT DOCUMENTS

| | | | |
|---|---|---|---|
| 6,390,113 B1* | 5/2002 | Reif | F01L 9/04 |
| | | | 137/1 |
| 6,651,629 B2 | 11/2003 | McCoy et al. | |
| 6,889,121 B1 | 5/2005 | Shahroudi et al. | |
| 2001/0003971 A1* | 6/2001 | Hori | F01L 9/04 |
| | | | 123/90.11 |
| 2004/0016461 A1 | 1/2004 | Qu et al. | |
| 2004/0181760 A1* | 9/2004 | Ismailov | F02D 41/20 |
| | | | 703/2 |
| 2005/0279867 A1* | 12/2005 | Ismailov | F02D 41/20 |
| | | | 239/585.1 |
| 2009/0005955 A1 | 1/2009 | Askew | |
| 2017/0234920 A1* | 8/2017 | Nair | F02D 41/20 |
| | | | 361/209 |

FOREIGN PATENT DOCUMENTS

| | | |
|---|---|---|
| EP | 2072791 A1 | 6/2009 |
| WO | WO2012/156241 A2 | 11/2012 |

\* cited by examiner

DETECTION OF VALVE OPEN TIME FOR SOLENOID OPERATED FUEL INJECTORS

TECHNICAL FIELD

This instant specification relates to determining the response timing of electromagnetic actuators.

BACKGROUND

Solenoid mechanisms generally include a coil and an armature that is free to move within the coil. The armature is normally spring loaded away from the energized position such that when a power pulse is applied to the coil, the armature is pulled into the energized position and in moving opens or closes the valve. In general, once the solenoid has moved to the end of its operating stroke, no further work is done by the armature.

The solenoid is often combined with a two-position valve, whereby the valve is pulled by the solenoid (when energized) and returned by a spring (when de-energized). The valve attached to the solenoid can be closed in one position and open in the second position, or it can be a changeover valve with two seats. In some applications, such as fuel injectors, it is desirable to measure and control the timing of the opening and closing positions of the solenoid operated valves.

Diesel fuel injectors need to have precise operating times. The valve determines the fuel injection timing. The valve also determines the fuel injection duration, which impacts the quantity of fuel injected into a cylinder of a diesel engine. The performance of the engine (balance between cylinders, power, fuel consumption, emissions) is thus affected.

SUMMARY

In general, this document describes systems and techniques for determining the response timing of electromagnetic actuators.

In a first aspect, a method for determining actuator actuation time includes evaluating an analog electrical current waveform, determining a Boolean waveform based on the evaluated analog electrical current waveform, determining a collection of one or more first durations based on one or more on times identified from the Boolean waveform, determining a collection of one or more second durations based on one or more off times identified from the Boolean waveform, comparing the first durations and the second durations, determining, based on the comparing, an event based on the comparing, identifying a time at which the event occurred, and providing the time as a completion time.

Various implementations can include some, all, or none of the following features. The analog electrical current waveform can be in hysteresis and can vary on a periodic interval across a range of values between a predetermined low current level and a predetermined high current level higher than the low current level. Determining a Boolean waveform based on the evaluated analog electrical current waveform can include identifying a transition from a Boolean off value to a Boolean on value in the Boolean waveform based on the analog electrical current waveform varying from a current level below a first current threshold value to a current level equal to or above the first current threshold, and identifying a transition from a Boolean on value to a Boolean off value in the Boolean waveform based on the analog electrical current waveform varying from a current level equal to or above a second current threshold value to a current level below the second current threshold. Determining, based on the comparing, an event based on the comparing can include determining a collection of first interpolated values based on an interpolation of timewise adjacent pairs of the first durations, determining a collection of second interpolated values based on an interpolation of timewise adjacent pairs of the second durations, and determining a collection of differences between the first interpolated values and timewise corresponding ones of the second interpolated values, wherein the event is based on the collection of differences. Determining, based on the comparing, an event based on the comparing can include comparing ones of the first durations with timewise corresponding ones of the second durations to identify a minimum difference value, and identifying a timewise location of the minimum difference value as the event. The minimum difference value can be zero. Determining, based on the comparing, an event based on the comparing can include determining a collection of differences between ones of the first durations and timewise corresponding ones of the second durations, each of the differences having a numerical sign, identifying a timewise location of a change in the numerical signs of timewise adjacent pairs of the collection of differences, and identifying the timewise location of the change in the numerical signs as the event. Determining, based on the comparing, an event based on the comparing can include identifying a first greater value between a selected first duration of the first durations and a second duration of the second durations that corresponds timewise to the selected first duration, identifying whether the first greater value was taken from the first durations or was taken from the second durations, identifying a second greater value between another first duration of the first durations that is timewise adjacent to the selected first duration and another second duration of the second durations that corresponds timewise to the another first duration, identifying whether the second greater value was taken from the first durations or was taken from the second durations, determining that the first greater value and the second greater value were taken from different ones of the first durations or the second durations, and identifying the timewise location of the second greater value as the event. Determining, based on the comparing, an event based on the comparing can include determining duty cycle values based on the Boolean waveform, determining a timewise location at which the duty cycle settles within a predetermined duty cycle band, and identifying the timewise location as the event. The method can include identifying a start time before identifying the completion time, determining a third duration as a difference between the start time and the completion time, and providing the third duration as valve time-to-completion duration value. The analog electrical current waveform can be evaluated during an actuator keep-in phase and the start time is the start of the keep-in phase.

In a second aspect, an actuator control system includes an actuator configured to transition between a first configuration and a second configuration in response to an input signal, a controller configured to perform operations including evaluating an analog electrical current waveform, determining a Boolean waveform based on the evaluated analog electrical current waveform, determining a collection of one or more first durations based on one or more on times identified from the Boolean waveform, determining a collection of one or more second durations based on one or more off times identified from the Boolean waveform, comparing the first durations and the second durations, determining, based on the comparing, an event based on the comparing, identifying a time at which the event occurred, and providing the time as a completion time.

Various embodiments can include some, all, or none of the following features. The analog electrical current waveform can be in hysteresis and can vary on a periodic interval across a range of values between a predetermined low current level and a predetermined high current level higher than the low current level. Determining a Boolean waveform based on the evaluated analog electrical current waveform can include identifying a transition from a Boolean off value to a Boolean on value in the Boolean waveform based on the analog electrical current waveform varying from a current level below a first current threshold value to a current level equal to or above the first current threshold, and identifying a transition from a Boolean on value to a Boolean off value in the Boolean waveform based on the analog electrical current waveform varying from a current level equal to or above a second current threshold value to a current level below the second current threshold. Determining, based on the comparing, an event based on the comparing can include determining a collection of first interpolated values based on an interpolation of timewise adjacent pairs of the first durations, determining a collection of second interpolated values based on an interpolation of timewise adjacent pairs of the second durations, and determining a collection of differences between the first interpolated values and timewise corresponding ones of the second interpolated values, wherein the event is based on the collection of differences. Determining, based on the comparing, an event based on the comparing can include comparing ones of the first durations with timewise corresponding ones of the second durations to identify a minimum difference value, and identifying a timewise location of the minimum difference value as the event. The minimum difference value can be zero. Determining, based on the comparing, an event based on the comparing can include determining a collection of differences between ones of the first durations and timewise corresponding ones of the second durations, each of the differences having a numerical sign, identifying a timewise location of a change in the numerical signs of timewise adjacent pairs of the collection of differences, and identifying the timewise location of the change in the numerical signs as the event. Determining, based on the comparing, an event based on the comparing can include identifying a first greater value between a selected first duration of the first durations and a second duration of the second durations that corresponds timewise to the selected first duration, identifying whether the first greater value was taken from the first durations or was taken from the second durations, identifying a second greater value between another first duration of the first durations that is timewise adjacent to the selected first duration and another second duration of the second durations that corresponds timewise to the another first duration, identifying whether the second greater value was taken from the first durations or was taken from the second durations, determining that the first greater value and the second greater value were taken from different ones of the first durations or the second durations, and identifying the timewise location of the second greater value as the event. Determining, based on the comparing, an event based on the comparing can include determining duty cycle values based on the Boolean waveform, determining a timewise location at which the duty cycle settles within a predetermined duty cycle band, and identifying the timewise location as the event. The operations can include identifying a start time before identifying the completion time, determining a third duration as a difference between the start time and the completion time, and providing the third duration as valve time-to-completion duration value. The analog electrical current waveform can be evaluated during an actuator keep-in phase and the start time is the start of the keep-in phase.

The systems and techniques described herein may provide one or more of the following advantages. First, a system can provide monitoring, diagnostics and prognostics of the mechanical motion of the armature component (e.g., valve) of injectors. Second, the system can provide precise and repeatable fuel delivery when combined with Valve Close Time detection. Third, the system can provide non-intrusive adaptive (e.g., dynamic) fuel trimming as an injector or other electromagnetic actuator ages. Fourth, the system can enable fast automated calibration of injectors or valves on an engine. Fifth, the system can enable cylinder balancing and detect imbalances in any injector. Sixth, the system can improve shot-to-shot accuracy of a given injector by using valve open detection in a control loop. Seventh, the system can determine information for use in the diagnosis of spring failures, sticky valves, valve wear, loose electrical connectors and incorrect control settings. Eighth, the system can determine information that can be used in a process to protect an engine from injector related failures and resist control run-offs, wandering, and other instabilities. Ninth, the system can determine bounce metrics, such as how long an injector armature bounced, time of the first bounce, and armature settling time.

The details of one or more implementations are set forth in the accompanying drawings and the description below. Other features and advantages will be apparent from the description and drawings, and from the claims.

DETAILED DESCRIPTION

This document describes systems and techniques for determining the response timing of an electromagnetic actuator (e.g., the time at which an actuator has arrived at a desired position). Although the examples given below are generally described in the context of solenoid operated fuel injectors, the systems and techniques herein may also be applied to other forms of electromagnetic actuators, such as solenoids, servo motors, stepper motors, linear motors, or combinations of these and any other appropriate form of actuator.

In general, to meet stringent emissions and efficiency requirements, engine controllers are designed to deliver precise amounts of fuel to a cylinder of a reciprocating engine at precise times within the combustion cycle. This is generally done by adjusting the start and duration of the current waveform that actuates a solenoid-operated fuel injector valve. The valve could be a single stage or part of a multi-staged electro-hydraulic or electro-pneumatic injection system. For example, in common-rail diesel applications, the valve can actuate a second hydraulic stage (e.g., nozzle) injector or pump.

In general, consistent fuel delivery control can be achieved through the use of feedback to identify the moment at which the fuel valve is open and/or the moment that the valve actually closes. It is possible to detect the mechanical motion of the armature component (e.g., valve) of injectors by monitoring the electrical current drawn by the solenoid valve. In some implementations, valve open time (VOT) detection can also be applied in the diagnosis and prognosis of valve and injector wear, and can allow the controller to employ trimming to account for wear and age, as well as let an operator know when the injector needs replacement. In some implementations, VOT detection can also be used to reduce currents in the later stages of the driving waveform to reduce power consumption, which in some embodiments can increase the service life of the actuator and/or reduce the cost of electronic drivers for the actuators.

Figure 1:
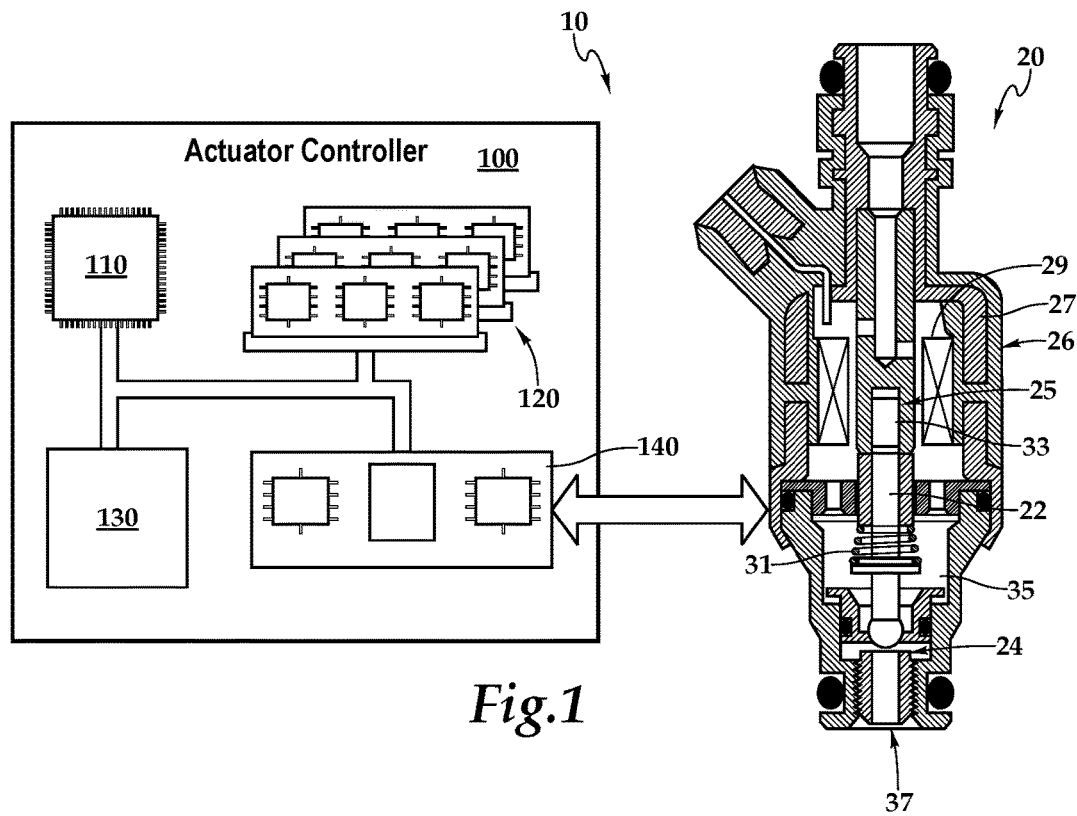
FIG. 1 is a schematic diagram that shows an example of a system for determining the response timing of an electromagnetic actuator.

FIG. 1 is a schematic diagram that shows an example of a system 10 for determining the response timing of an electromagnetic actuator, such as a solenoid-operated fuel injector 20. An actuator controller 100, such as an Engine Control Module (ECM), is a hysteretic current controller used to determine valve open time (VOT). By determining VOT, the controller 100 can monitor, diagnose, and/or predict the mechanical motion of the armature component (e.g., valve) of the fuel injector 20.

The fuel injector 20 is a solenoid valve that includes a valve 22 (e.g., a needle valve) that is moveable between a first configuration in which the valve 22 is at a mechanical "closed" position 24, and a second configuration in which the valve 22 is at a mechanical "open" position 25. The valve 22 is driven by a solenoid 26 having a stator 27, solenoid coil 29, return spring 31, and armature 33. At rest, the spring 31 urges the valve 22 toward the "closed" position 24, thereby blocking the flow of a pressurized fuel from a fuel passage 35 (e.g., a fuel gallery) to a fuel nozzle 37. The fuel injector 20 operates when a current is applied to the solenoid coil 29 from the controller 100, pulling the armature 33 with enough force to overcome the bias of the spring 31 and moving the valve 22 toward the "open" position 25, thus allowing pressurized fuel to flow from the fuel passage 35 to the fuel nozzle 37.

The controller 100 provides the control signals (e.g., current) that energize the solenoid coil 29, which in turn causes the valve 22 to open. The controller 100 also monitors the control signals (e.g., current) to determine when the valve 22 has reached the "open" position 25. Valve open time (VOT) is the time at which the valve 22 has reached the "open" position 25. Generally speaking, by determining the time at which the valve 22 is at the "open" position 25, the controller 100 can determine when it may reduce current to the solenoid coil 29 (e.g., to conserve power), and/or determine the amount of time the valve 22 took to move from the "closed" position 24 to the "open" position 25 (e.g., to calibrate valve timing, diagnose malfunctions, predict malfunctions).

The controller 100 can be used for the operations described herein according to one implementation. The controller 100 includes a processor 110, a memory 120, a storage device 130, and switching controller 140. Each of the components 110, 120, 130, and 140 are interconnected using a system bus 150. The processor 110 is capable of processing instructions for execution within the system 100.

In one implementation, the processor 110 is a field-programmable gate array (FPGA) processor. For example, with the advent of very fast FPGAs, it is possible to look carefully at the switching controller 140 logic and detect very small variations in current and voltage waveforms at very fast clock rates.

In another implementation, the processor 110 is a single-threaded processor. In another implementation, the processor 110 is a multi-threaded processor. In some implementations, the processor 110 is capable of processing instructions stored in the memory 120 or on the storage device 130 to collect information from, and provide control signals to, the fuel injector 20.

The memory 120 stores information within the controller 100. In some implementations, the memory 120 can be a computer-readable medium. In some implementations, the memory 120 can be a volatile memory unit. In some implementations, the memory 120 can be a non-volatile memory unit.

The storage device 130 is capable of providing mass storage for the system 100. In one implementation, the storage device 130 is a computer-readable medium. In various different implementations, the storage device 130 may be non-volatile information storage unit (e.g., FLASH memory).

The switching controller 140 provides control signal output operations for the controller 100. In one implementation, the switching controller 140 provides actuation control signals to the fuel injector 20, such as pulse width modulated (PWM) driver signals. For example, the switching controller 140 can include field effect transistors (FETs) or other switching devices that can convert a logic-level signal from the processor 110 to a current and/or voltage waveform with sufficient power to drive the solenoid coil 29. In another implementation, the switching controller 140 receives feedback signals from the fuel injector 20, such as impedance values (L, R), rise time constants (L/R), and back-propagated electromagnetic force signals (e.g., back-EMF).

The features described herein can be implemented in digital electronic circuitry, or in computer hardware, firmware, software, or in combinations of them. The apparatus can be implemented in a computer program product tangibly embodied in an information carrier, e.g., in a machine-readable storage device for execution by a programmable processor; and method steps can be performed by a programmable processor executing a program of instructions to perform functions of the described implementations by operating on input data and generating output. The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

In some implementations, this detection, along with valve close time data can be used to calibrate and compensate the timing of the fuel injector 20 actuation to improve the precision and/or repeatability of fuel delivery. In some implementations, the determination of VOT can enable non-intrusive, adaptive (e.g., dynamic) fuel trimming as the fuel injector 20 ages. In some implementations, VOT detection can be used to reduce electrical current in the later stages of the driving waveform used to actuate the fuel injector 20, which in some applications can be done to reduce power consumption, increase service life, and/or reduce the cost of the fuel injector 20 and/or the controller 10.

Figure 2:
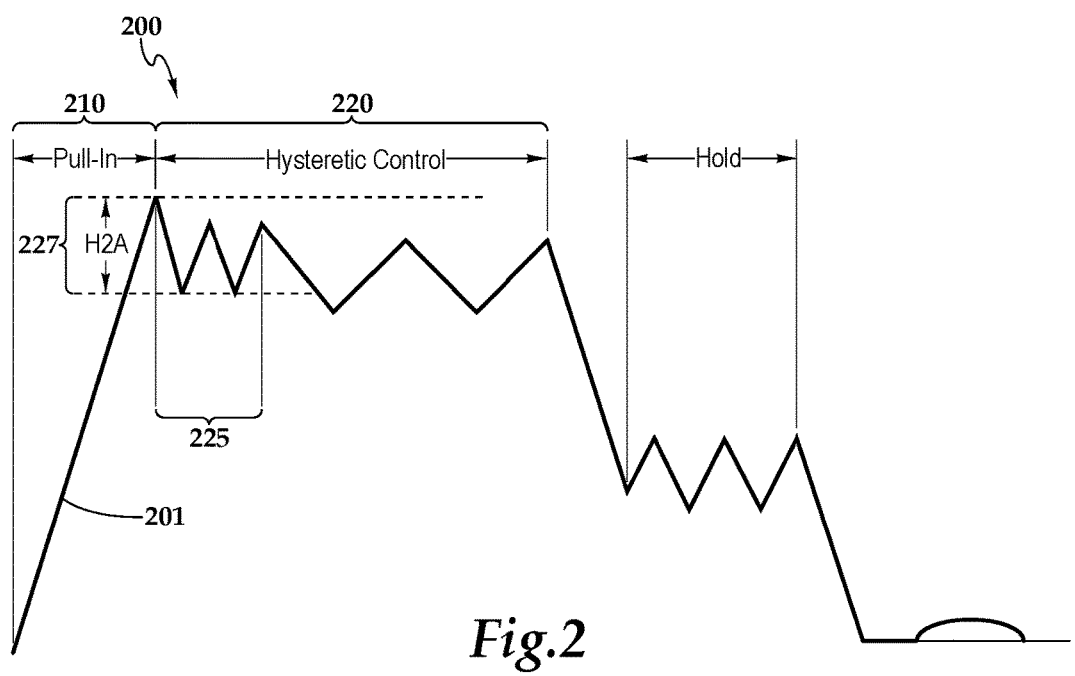
FIG. 2 is a chart of an example current waveform of an electromagnetic actuator.

FIG. 2 is a chart 200 of an example current waveform 201 of an electromagnetic actuator. In some implementations, the current waveform 201 can represent the current observed as the example controller 100 of FIG. 1 causes the valve 22 of the example fuel injector 20 to open.

In general, the controller 100 defines current profiles for actuation by subdividing a substantially whole current profile into multiple segments. In some implementations, each segment can be configured with a set of parameters that define the control scheme for FET bridge circuitry. In some implementations, each segment can be configured to analyze high and/or low side comparator (HSC/LSC) switching. In some implementations, signal filtering may be done in the FPGA to reduce FET related noise before the segmentation is performed.

The current waveform 201 represents the current observed as an electromagnetic actuator is actuated, for example, as the valve 22 of the fuel injector 20 opened. The current waveform 201 includes a number of segments that represent various phases of actuation.

During a pull-in phase 210, current is increased to increase the strength of the magnetic field acting upon an armature (e.g., the armature 33). As the strength of the field increases, at some point the armature will start to move from its seat (e.g., the "closed" position 24) and accelerate until it reaches its stop (e.g., the "open" position 25).

During a hysteretic control phase 220, the current waveform 201 oscillates in response to the armature hitting a hard stop (e.g., the valve 22 reaches the "open" position 25). VOT is determined during a hysteretic control segment 225 (also identified as T2A, or a "keep-in" phase), during which the rising and falling times of the current waveform 201 are compared to a hysteresis band 227, also identified as H2A. The rise and fall times of the coil current can be explained by the following equation:

$$\frac{dI}{dt} = \frac{(V - EMF_b - IR)}{L}$$

Where:
L is coil inductance (Henries), which is a function of coil current I (Amps) and armature position x (meters).
V is the voltage (volts) supplied during the T2A phase, the hysteretic control segment 225.
$EMF_b$ is the back EMF (volts).
IR is the resistance (ohms).

The voltage can be a boosted or battery voltage, but typically 24V battery voltage is used for common rail applications. $EMF_b$ refers to the back-electromotive forces generated during the armature motion and it opposes the driving voltage during the pull-in phase. Once the armature hits a hard stop, such as at the "open" position 25, the $EMF_b$ abruptly drops to substantially zero and this can be detected by monitoring at the current and FET comparator waveforms. Under the hysteretic current control described herein, the FET comparator duty cycles are monitored to determine when the armature 33 has reached the "open" position 25. The time at which the valve 22 reaches the "open" position 25 is considered to be the valve open time (VOT).

The hysteretic control phase 220 can be partitioned into two intervals—before and after the armature 33 hits the stop at the "open" position 25. Before the armature 33 hits the stop, the $EMF_b$ is very large and abruptly drops to substantially zero once the armature 33 hits the stop. From the equation above, the current slew rates are primarily controlled by the $EMF_b$. Inductance (L), resistance (IR) and voltage (V) can be approximated as constant. Under such circumstances, the pulse width modulation (PWM) duty cycles of the switching controller 140 (e.g., FET comparators) can level off after the armature 33 hits the stop.

Figure 3A:
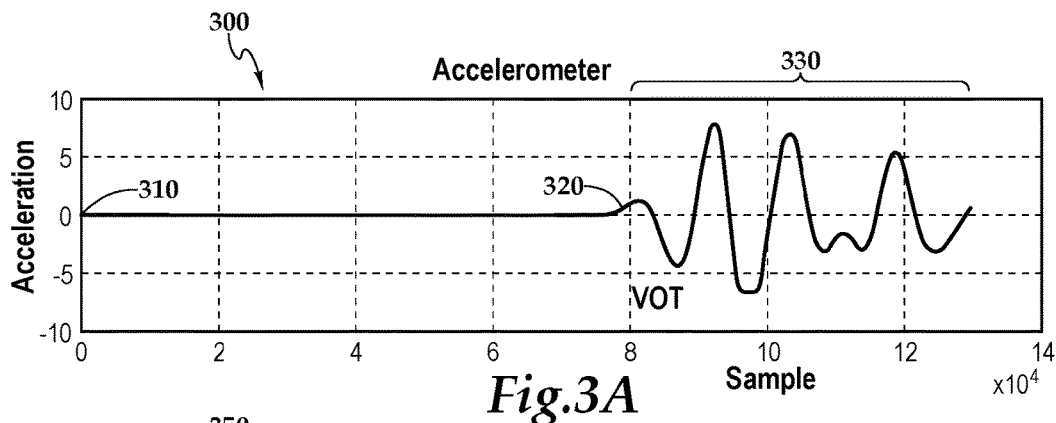
FIGS. 3A and 3B are charts of a comparison of an example accelerometer feedback waveform and an example pulse width modulation duty cycle of an electromagnetic actuator.
Figure 3B:
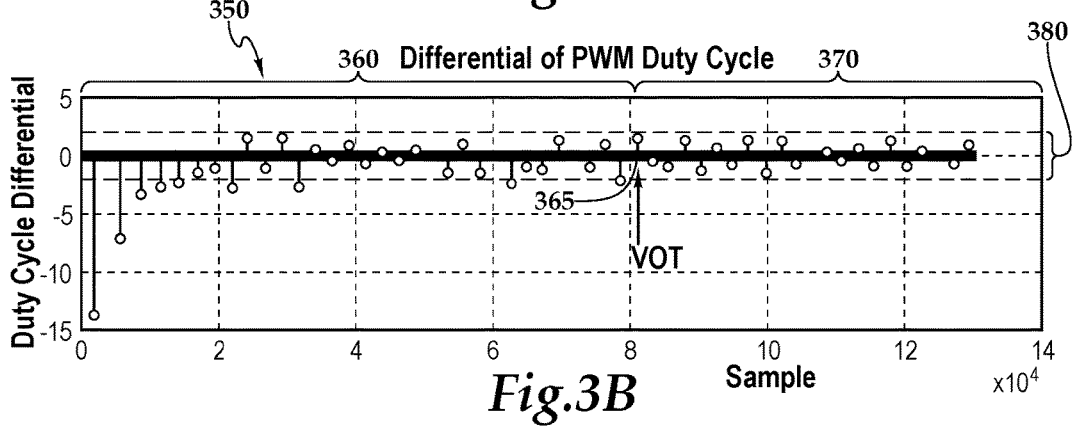

FIGS. 3A and 3B are charts of a comparison of an example accelerometer feedback waveform 300 and an example pulse width modulation duty cycle waveform 350 of an electromagnetic actuator. As illustrated by the example waveforms 300 and 350, VOT can be determined by monitoring changes in the PWM duty cycle, and detecting the settling time within a defined band.

Referring to FIG. 3A, the example accelerometer feedback waveform 300 represents a feedback signal received from an accelerometer configured to measure acceleration/vibration of an electromagnetic actuator as it is actuated to a stop position. In some implementations, the electromagnetic actuator can be the fuel injector 20 of FIG. 1, or any other appropriate electromagnetic actuator such as a solenoid or electric motor. In some implementations, the waveform 300 can represent acceleration/vibration associated with the fuel injector 20 being actuated from the "close" position 23 and the "open" position 25.

The waveform 300 starts at point 310, at sample zero and approximately zero acceleration/vibration. The amplitude of the waveform 300 remains close to zero amplitude until point 320, at approximately sample=$8\times10^4$, after which point the amplitude of the waveform 300 oscillates greatly during a period 330. The point 320 represents the point in time when the electromagnetic actuator begins to vibrate as a result of the armature hitting a hard stop (e.g., causing the accelerometer to "ring").

Referring now to FIG. 3B, the example PWM duty cycle differential waveform 350 represents the differential of PWM duty cycles across the same sample interval illustrated in FIG. 3A. During a settling sample period 360, the waveform 350 varies widely, with the variation decaying over time. At a point 365, a settled sample period 370 begins. During the settled sample period 370, the waveform 350 has settled within an error band 380.

The width of the error band 380 is selected such that the settling of the waveform 350 and the start of the settled sample period 370, the point 365, corresponds sample-wise and timewise with the point at which the electromagnetic actuator begins to vibrate (e.g., point 320, approximately sample=$8.1\times10^4$). As such, the point 365 represents the sample at which the electromagnetic actuator has hit a stop, or as in the example of the fuel injector 20, the time at which the valve 22 has reached the "open" position 25, or in other words, the VOT of the fuel injector 20.

As the example waveform 350 illustrates, the settling time of a transfer function can be measured and can be estimated as the time elapsed from start of the delivery of current to an electromagnetic actuator to the time at which the output (e.g., in this example, the differential of duty cycle), has entered and remained within a specified error band (e.g., the error band 380), which is usually symmetrical about the final value. In the example of the waveform 350, the settling sample period 360 starts at sample=0 and lasts until approximately sample=$8.1\times10^4$. The timewise duration of the settling sample period 360, and therefore the VOT, can be determined by multiplying the sample count by the sampling interval. For example, in the illustrated example, the sampling rate can be about 20 MHz.

Figure 4A:
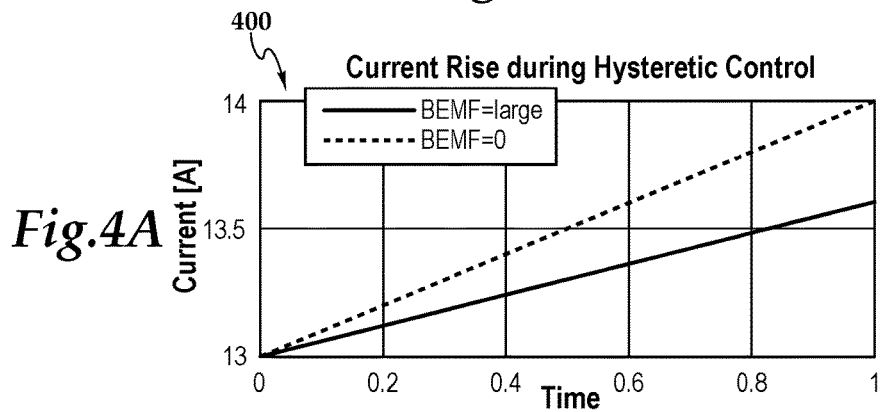
FIGS. 4A and 4B are charts of an example current rise and current fall during hysteretic control of an electromagnetic actuator.
Figure 4B:
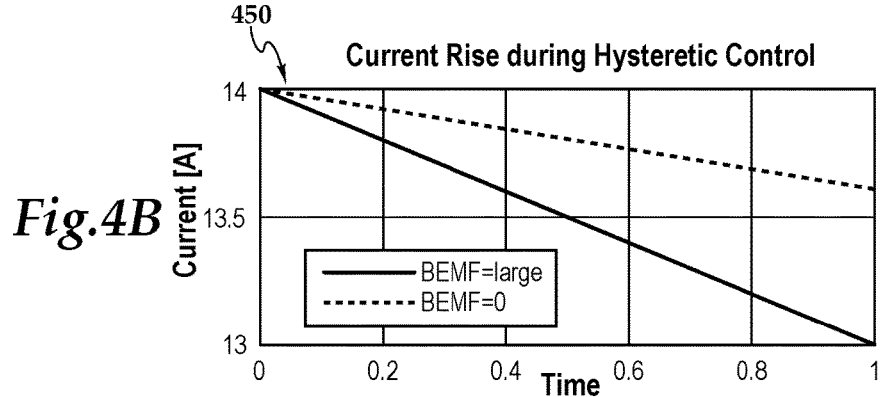

FIGS. 4A and 4B are charts of an example current rise time 400 and current fall time 450 during hysteretic control of an electromagnetic actuator. In some implementations, the electromagnetic actuator can be the fuel injector 20 of FIG. 1, or any other appropriate electromagnetic actuator such as a solenoid or electric motor. In some implementations, the current rise time 400 and current fall time 450 may be determined by the actuator controller 100.

In these examples, another version of the VOT algorithm monitors the current rise time 400 and current fall time 450 separately by monitoring the switching controller 140 (e.g., FET comparator) ON and OFF times.

During hysteretic control T2A phase, the current rise time 400 is slower when $EMF_b$ is active (e.g., when the armature is moving) and is faster when $EMF_b$ is approximately zero (e.g., when armature hits the stop). This is evident from the equation mentioned above, as $EMF_b$ opposes the driving voltage and reduces the slew rate. In some implementations, this can mean that the FET ON time can be larger initially and then drop abruptly when $EMF_b$ goes to zero.

In the example of FIG. 4B, the current fall time 450 is faster when the $EMF_b$ is active compared to when $EMF_b$ goes to substantially zero. This is also evident from the equation above, as during the fall or decay time of the hysteretic pulse there is substantially no applied voltage (e.g., there may be a small residual bias voltage) and any $EMF_b$ present will drive the current fall faster. In some implementations, this can mean that the FET OFF time can be small initially and then abruptly bump up when $EMF_b$ goes to approximately zero. In some implementations, when the armature hits a stop, the FET ON time and FET OFF times can intersect, and can be easily detected by a processor (e.g., the actuator controller 100 of FIG. 1), as will be discussed further in the descriptions of FIGS. 5A-5D.

FIGS. 5A-5D are charts of example waveforms for detecting armature stop of an electromagnetic actuator. In some implementations, the electromagnetic actuator can be the fuel injector 20 of FIG. 1, or any other appropriate electromagnetic actuator such as a solenoid or electric motor. In some implementations, the waveforms may be measured by the actuator controller 100. In some implementations, the sampling rate for the example waveforms can be about 100 MHz.

Figure 5A:
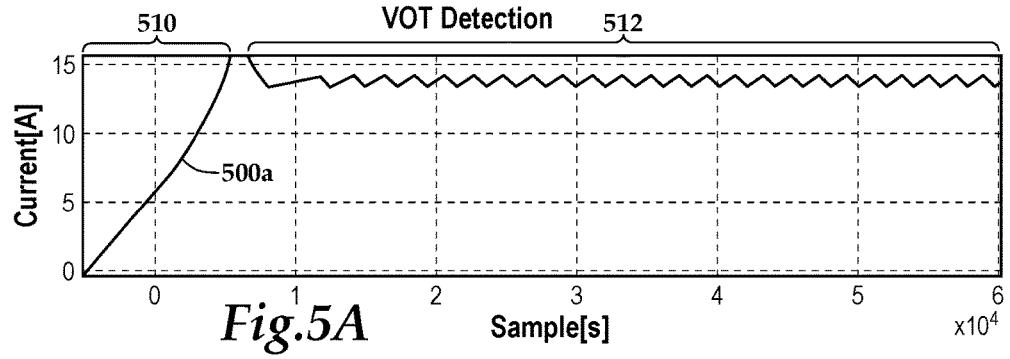
FIGS. 5A-5D are charts of example waveforms for detecting armature stop of an electromagnetic actuator.

FIG. 5A shows a chart of an example waveform 500a. The waveform 500a illustrates electrical current (amps) applied to an electromagnetic actuator (e.g., current provided to the coil 29 of the example fuel injector 20 of FIG. 1) across a collection of periodic samples during a predetermined period of time. The waveform 500a shows that there is a sharp rise in actuator current during an initial period 510 (e.g., when the valve 22 starts to move), and the current levels out during a period 512 (e.g., when the valve 22 is in motion).

Figure 5B:
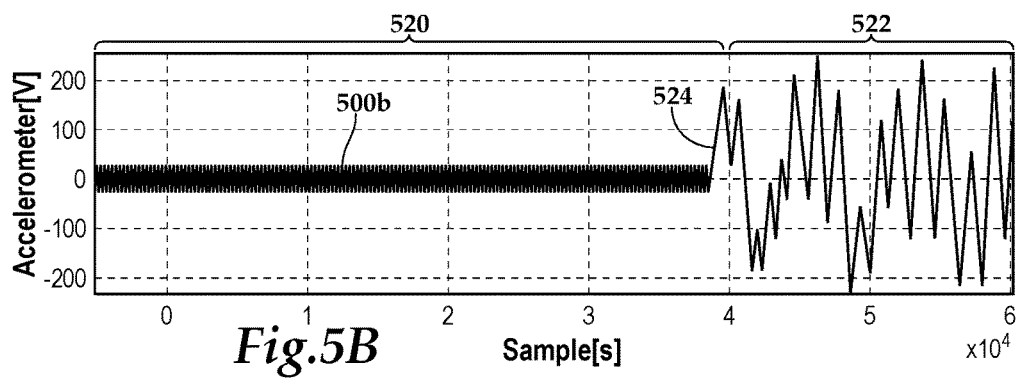

FIG. 5B shows a chart of an example waveform 500b. The waveform 500b represents a feedback signal from an accelerometer that is configured to sense acceleration/vibration of the electromagnetic actuator (e.g., the example fuel injector 20) as a result of the armature of the actuator reaching a stop (e.g., the needle 22 hitting the "open" position 25). During an initial period 520, the amplitude of the waveform 500b is relatively low, oscillating about a value of approximately zero. The initial period 520 ends and an oscillatory period 522 begins at a point 524. The oscillatory period 522 shows that the amplitude and frequency of the waveform 500b changes greatly, relative to the character of the waveform 500b during the initial period 522. The relatively greater oscillations of the waveform 500b during the period 522 illustrate that the electromagnetic actuator vibrates (e.g., rings) in response to the armature hitting the stop at a point in time approximately represented by the point 524.

Figure 5C:
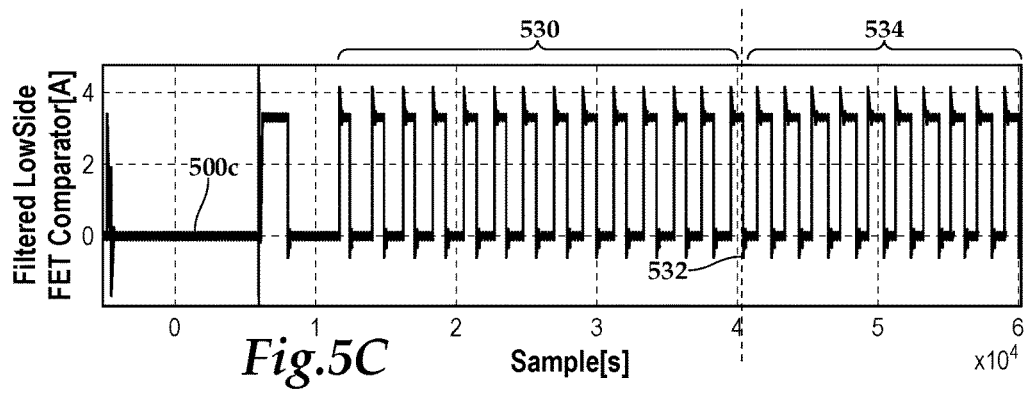

FIG. 5C shows a chart of an example waveform 500c. The waveform 500c represents a filtered hysteretic current pulse waveform provided by a FET comparator (e.g., the example switching controller 140) to drive the electromagnetic actuator (e.g., to the coil 27 of the example fuel injector 20). The waveform 500c is a substantially Boolean (e.g., rectangular), pulse width modulated (PWM) current waveform. A period 530 represents the portion of the waveform 500c while the armature is in motion. Initially, the durations of the FET "on" times of each cycle are less than the durations of the corresponding FET "off" times. During the period 530, the width of the "on" portions of the PWM pulses generally grow as the widths of their corresponding "off" portions shrink.

In some implementations, the waveform 500c can be determined from the waveform 500a. For example, the waveform 500a is in hysteresis and varies on a periodic interval across a range of values between a predetermined low current level value (e.g., a threshold below which the FET is considered to be "off") and a predetermined high current level value that is higher than the low current level (e.g., a threshold above which the FET is considered to be "on"). A corresponding Boolean waveform, such as the waveform 500c, can be constructed of substantially rectangular waves having "on" durations and corresponding "off"

durations that reflect the locations where the waveform 500a crosses the predetermined high and low level values.

In some implementations, the waveform 500c can be based on identifying a transition from a Boolean off value to a Boolean on value in the Boolean waveform based on the analog electrical current waveform varying from a current level below a first current threshold value to a current level equal to or above the first current threshold, and identifying a transition from a Boolean on value to a Boolean off value in the Boolean waveform based on the analog electrical current waveform varying from a current level equal to or above a second current threshold value to a current level below the second current threshold. For example, during the period 512 of FIG. 5A, the example waveform 500a illustrates the values of an electrical current that varies from approximately 13 A to approximately 14 A. An "on" threshold may, for example, be set at 13.6 A, and when the waveform 500a increases from less than 13.6 A to equal to or greater than 13.6 A, the current is considered to be "on". Likewise, an "off" threshold may, for example, be set at 13.4 A, and when the waveform 500a decreases from greater than 13.4 A to equal to or less than 13.4 A, the current is considered to be "off". In some examples, the waveform 500c may be determined based on these "on" and "off" times.

In another example, the waveform 500a can oscillate in an approximately saw tooth pattern made up of alternating increasing and decreasing segments. Each increasing portion can be identified as an "on" portion (e.g., the current rises because the FET is on) and each decreasing portion can be identified as an "off" portion (e.g., the current drops because the FET is off) of a corresponding Boolean waveform. As such, in some examples, the durations of the increasing and decreasing portions of a current waveform can be measured to determine "on" and "off" times for a corresponding Boolean waveform.

A point 532 approximately represents a point in the waveform 500c at which the PWM pulses have reached at 50% duty cycle, or in other terms, the point where the FET "on" times and FET "off" times are approximately equal. A period 534 presents the portion of the waveform 500c in which the width of the "on" portions of the PWM pulses continue to grow past the 50% duty cycle.

The FET "on" times and the FET "off" times of each hysteretic pulse in the waveform 500c can be compared to identify the point 532, or any other appropriate point (e.g., PWM duty cycle ratio). This comparison is illustrated in FIG. 5D.

Figure 5D:
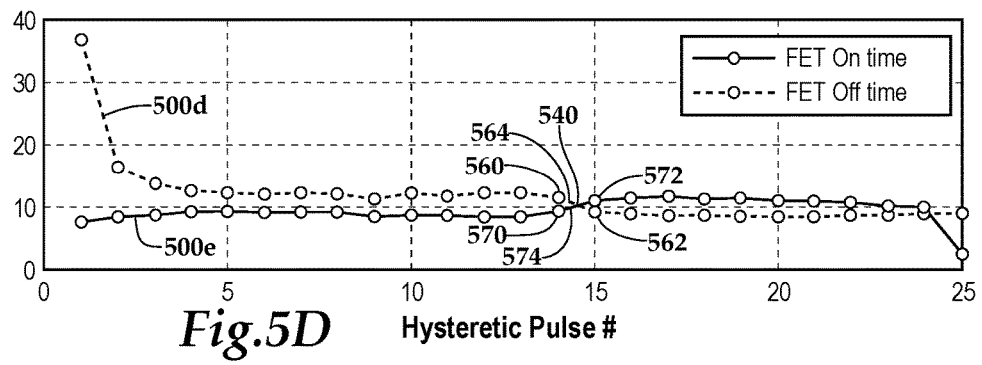

FIG. 5D shows a chart of an example collection 500d of FET "off" times and an example collection 500e of FET "on" times for each of the hysteretic pulses of the waveform 500c. As illustrated by the collection 500d, the FET "off" times are initially relatively long and decrease with subsequent pulses. The corresponding FET "on" times illustrated by the collection 500d are initially relatively short and grow with subsequent pulses. At approximately a point 540 (e.g., sometime between pulse #14 and pulse #15), the durations of the FET "on" times and the FET "off" times are approximately equal, which is represented conceptually in FIG. 5D by the collection 500d and the collection 500e intersecting at the point 540.

Since FET duty ratios are affected by the amount of back EMF being generated by the electromagnetic actuator being driven, and since the back EMF changes at least partly depending on whether or not the armature is moving or has stopped, the changes in FET duty ratios illustrated by FIG. 5D can be used to determine when the armature has stopped moving. In the context of the example system 10 of FIG. 1, the FET duty ratios being applied by the actuator controller 100 to the fuel injector 20 can be compared to determine when the needle 22 has reached the "open" position 25. This time can be identified as the valve open time, or VOT.

In some implementations, once the VOT has been identified, the amount of time required to open the valve, or to actuate any other appropriate armature to a predetermined stop location, can be determined. For example, the actuator controller 100 can identify a time at which actuation of an actuator is started, and the VOT time can identify when the actuation is substantially complete. By comparing the difference between the start time and the VOT, the amount of time taken to complete the actuation (e.g., valve opening time) can be determined.

In some implementations, determination of the actuation time can be used to modify the operation of the actuator. For example, combustion engine performance can depend greatly on the precise amounts of fuel being delivered by fuel injectors, and the amounts of fuel being delivered are partly dependent upon the opening and closing times of the injector valves, and on the lengths of time the valves are held open. A valve that opens more quickly than expected can result in excess fuel being delivered, while a slow valve can starve the combustion process (e.g., result in insufficient fuel being delivered). Furthermore, the opening and closing speeds of such fuel injectors can vary during their service lifetimes, for example, due to mechanical wear and debris buildup. By determining the VOT, the actuator controller 100 can adjust the timing and duration of the actuation of the fuel injector 20 to compensate for these functional variations, increase the accuracy of fuel delivery, and improve the performance of the engine in which the fuel injector 20 is being used.

Although the examples discussed with regard to FIGS. 5A-5D describe determining VOT of a PWM waveform having an initial FET on/off ratio of less than 50% and using the 50% duty cycle point as identifying the VOT, the techniques can be adapted for other applications. In some implementations, the waveform 500c can have a duty cycle that is initially greater than 50% and shrinks to a target ratio that is used to identify VOT. In some implementations, a target duty cycle other than 50% may be used. For example, experiments may show that for a particular embodiment and/or implementation of an electromagnetic actuator, a predetermined stop point may correspond to a 40%, 60%, or any other appropriate duty cycle ratio. This duty cycle ratio may then be used to identify VOT for the corresponding actuator embodiment and/or implementation.

Figure 6:
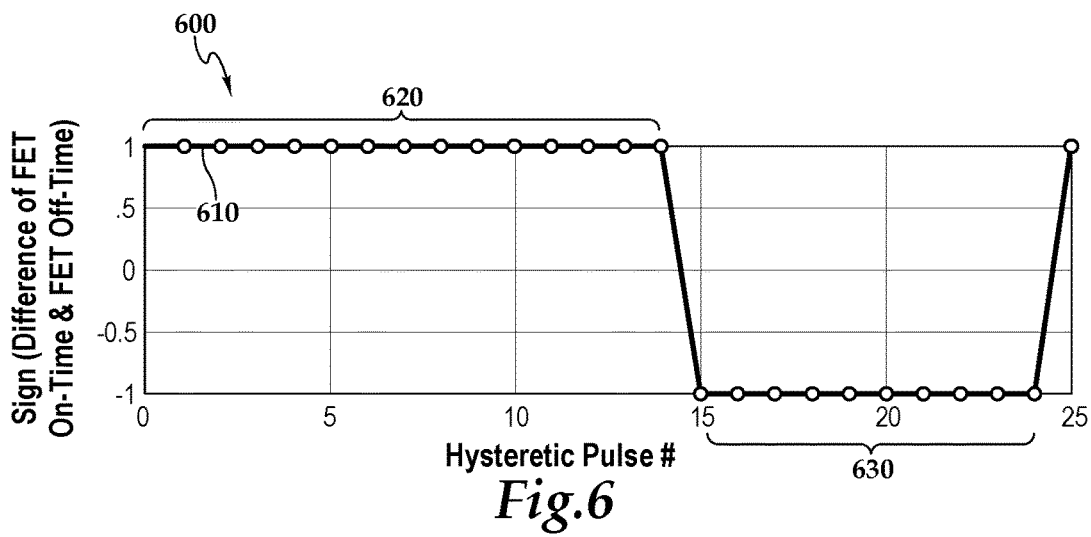
FIG. 6 is a chart of an example process for monitoring a sign change of the difference between pulse width modulation pulse widths for an electromagnetic actuator.

The technique illustrated by FIGS. 5A-5D can be modified, for example, to reduce the complexity of the processing performed to identify the VOT and/or to modify the robustness of the VOT identification process. FIG. 6 illustrates an example of one such modification.

FIG. 6 is a chart 600 of an example process for monitoring a sign change of the difference between pulse width modulation pulse widths for an electromagnetic actuator (e.g., the example fuel injector 20 of FIG. 1). In the illustrated example, the VOT determination process is modified to determine the mathematical differences between the FET "on" times and their corresponding "off" times, and then monitor the sign (e.g., positive or negative) of the differences rather than the actual difference values themselves. In the example of FIG. 6, the line 610 represents the signs of the differences between the FET "on" time and "off" time of a collection of hysteretic pulses (e.g., the example waveform 500c of FIG. 5C). When the duration of the "on" time of a pulse is subtracted from the duration of the corresponding "off" time, a positive value having a positive sign (e.g., +1) results.

During a period 620 (e.g., corresponding to the period 530 of FIG. 5C) the signs are positive. The positive signs are represented on the chart 600 as having a value of +1. The period 620 starts at pulse #0 and extends to approximately pulse #14. During a period 630 (e.g., corresponding to the period 534 of FIG. 5C) the signs are negative. The negative signs are represented on the chart 600 as having a value of −1. The period 630 starts at approximately pulse #15.

The signs change between pulse #14 and pulse #15, and this sign change can be used to identify a pulse during which the actuator has reached the stop/open position. The time of the identified pulse can then be used to determine VOT. In some implementations there could be multiple sign changes, for example as a result of the armature bouncing off a hard stop. In some such examples, the first sign change may be used to identify when the actuator has reached the stop/open position. In some examples, a predetermined subsequent pulse may be used to identify VOT. For example, the actuator may reach the stop/open position and be allowed to "bounce" a predetermined number of times during settling before being identified as "open". In some implementations, by monitoring such sign changes other bounce metrics can be determined as well, such as how long the armature bounced, the time of the first bounce, the armature settling time, and any other appropriate measure of armature bounce.

In some implementations, the VOT can be identified by monitoring an interpolated difference between the FET "on" and "off" times and detect the first zero crossing and declare it as VOT. For example, in the example of FIG. 5D, the value of a sample 560 of the collection 500d taken at hysteretic pulse 14 and the value of a sample 562 of the collection 500d taken at hysteretic pulse 15 can be interpolated (e.g., by determining a linear equation) to approximate a line 564, and the value of a sample 570 of the collection 500e taken at hysteretic pulse 14 and the value of a sample 572 of the collection 500e taken at hysteretic pulse 15 can be interpolated to approximate a line 574. Once the interpolated values have been determined, the point 540 may be approximated. In another example, the values of the samples 560, 562, 570, and 572 can be used to determine a system of linear equations that can be used to find the intersection of the lines 564 and 574, to identify the point 540.

In some implementations, the VOT can be identified by identifying a minima of the absolute difference between FET "on" and "off" times. In such examples, the location of such a minima can be used to identify the VOT. For example, the duty cycle of the example waveform 500c may vary toward, but not actually cross above or below a predetermined threshold duty cycle ratio (e.g., 50%). In such examples, the corresponding pair of values in the example collections 500d and 500e having the smallest difference may be identified as representing the VOT.

In some implementations, the VOT may be determined by monitoring one of the FET "on" times (e.g., the collection 500e) or the FET "off" times (e.g., the collection 500d), and monitoring those values for sharp deviations in respect to previous measurements. In some implementations, the FET "on" times and/or the FET "off" times can be compared against predetermined threshold value(s) expected for a given valve configuration. In some implementations, the low side and high side comparator outputs of an actuator driver (e.g., the example switching controller 140 of FIG. 1) can be monitored independently or in combination to determine FET "on" and "off" time comparisons to detect the VOT.

Figure 7:
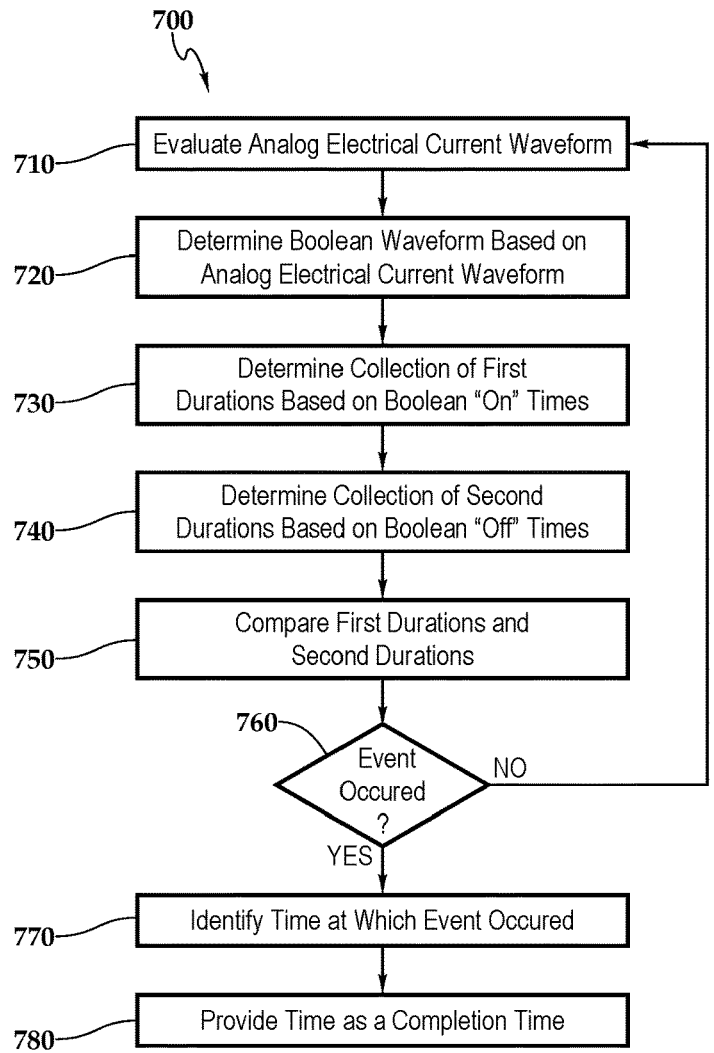
FIG. 7 is a flow diagram of an example process for determining the response timing of an electromagnetic actuator.

FIG. 7 is a flow diagram of an example process 700 for determining the response timing of an electromagnetic actuator. In some implementations, the process 700 may be performed by the example system 10 of FIG. 1.

At 710, an analog electrical current waveform is evaluated. For example, the example waveform 500a of FIG. 5A may be sampled by the actuator controller 100.

In some implementations, the analog electrical current waveform can be in hysteresis and can vary on a periodic interval across a range of values between a predetermined low current level and a predetermined high current level higher than the low current level. For example, the waveform 500a varies on a periodic interval between approximately 13 amps to approximately 14 amps.

At 720 a Boolean waveform is determined based on the evaluated analog electrical current waveform. For example, the example waveform 500c of FIG. 5C can be determined from the waveform 500a. For example, the waveform 500a can oscillate in an approximately saw tooth pattern made up of alternating increasing and decreasing segments, and each increasing portion can be identified as an "on" portion and each decreasing portion can be identified as an "off" portion of a corresponding Boolean waveform such as the waveform 500c.

At 730 a collection of one or more first durations is determined based on one or more on times identified from the Boolean waveform. For example, the example collection 500e of FIG. 5D can be determined from the FET "on" time durations identified in the waveform 500c.

In some implementations, determining a Boolean waveform based on the evaluated analog electrical current waveform further can include identifying a transition from a Boolean off value to a Boolean on value in the Boolean waveform based on the analog electrical current waveform varying from a current level below a first current threshold value to a current level equal to or above the first current threshold, and identifying a transition from a Boolean on value to a Boolean off value in the Boolean waveform based on the analog electrical current waveform varying from a current level equal to or above a second current threshold value to a current level below the second current threshold. For example, during the period 512 of FIG. 5A, the example waveform 500a illustrates the values of an electrical current that varies from approximately 13 A to approximately 14 A. An "on" threshold may, for example, be set at 13.6 A, and when the waveform 500a increases from less than 13.6 A to equal to or greater than 13.6 A, the current is considered to be "on". Likewise, an "off" threshold may, for example, be set at 13.4 A, and when the waveform 500a decreases from greater than 13.4 A to equal to or less than 13.4 A, the current is considered to be "off". In some examples, the waveform 500c may be determined based on these "on" and "off" times.

At 740 a collection of one or more second durations is determined based on one or more off times identified from the Boolean waveform. For example, the example collection 500d of FIG. 5D can be determined from the FET "off" time durations identified in the waveform 500c.

At 750, the first durations and the second durations are compared. For example, each hysteretic pulse represented in FIG. 5D includes a FET "on" time value of the collection 500e and a FET "off" time value of the collection 500d (e.g., the sample 560 and the sample 570 at pulse #14). The FET "on" time value can be subtracted from the FET "off" time value to determine a difference value for the corresponding pulse.

At 760, a determination is made. If it is determined, based on the comparing done at 750, that an event has not occurred, then the process 700 continues at 710. If it is determined (e.g., based on the comparing done at 750) that an event has occurred, then at 770 a time at which the event occurred is identified. At 780 the identified time is provided as a completion time (e.g., the VOT).

In some implementations, the comparing done at 750 can include determining a collection of first interpolated values based on an interpolation of timewise adjacent pairs of the first durations, determining a collection of second interpolated values based on an interpolation of timewise adjacent pairs of the second durations, and determining a collection of differences between the first interpolated values and timewise corresponding ones of the second interpolated values, wherein the event is based on the collection of differences. For example, in the example of FIG. 5D, the value of a sample 560 of the collection 500d taken at hysteretic pulse 14 and the value of a sample 562 of the collection 500d taken at hysteretic pulse 15 can be interpolated (e.g., by determining a linear equation) to approximate a line 564, and the value of a sample 570 of the collection 500e taken at hysteretic pulse 14 and the value of a sample 572 of the collection 500e taken at hysteretic pulse 15 can be to approximate a line 574. Once the interpolated values have been determined, the point 540 may be approximated. In another example, the values of the samples 560, 562, 570, and 572 can be used to determine a system of linear equations that can be used to find the intersection of the lines 564 and 574 to identify the point 540.

In some implementations, the comparing done at 750 can include comparing ones of the first durations with timewise corresponding ones of the second durations to identify a minimum difference value, and identifying a timewise location of the minimum difference value as the event. For example, the duty cycle of the example waveform 500c may vary toward, but not actually cross above or below a predetermined threshold duty cycle ratio (e.g., 50%). In such examples, the corresponding pair of values in the example collections 500d and 500e having the smallest difference may be identified as representing the VOT. In some implementations, the minimum difference value can be zero, for example at a 50% duty cycle where the duration of an "on" time and the corresponding "off" time are substantially equal.

In some implementations, the determining done at 760 can include determining a collection of differences between ones of the first durations and timewise corresponding ones of the second durations, each of the differences having a numerical sign, identifying a timewise location of a change in the numerical signs of timewise adjacent pairs of the collection of differences, and identifying the timewise location of the change in the numerical signs as the event. In the example of FIG. 6, the line 610 represents the signs of the differences between the FET "on" time and "off" time of a collection of hysteretic pulses (e.g., the example waveform 500c of FIG. 5C). The signs change between pulse #14 and pulse #15, and this sign change can be used to identify pulse during which the actuator has reached the stop/open position. The time of the identified pulse can then be used to determine VOT.

In some implementations, the determining done at 760 can include identifying a first greater value between a selected first duration of the first durations and a second duration of the second durations that corresponds timewise to the selected first duration, identifying whether the first greater value was taken from the first durations or was taken from the second durations, identifying a second greater value between another first duration of the first durations that is timewise adjacent to the selected first duration and another second duration of the second durations that corresponds timewise to the another first duration, identifying whether the second greater value was taken from the first durations or was taken from the second durations, determining that the first greater value and the second greater value were taken from different ones of the first durations or the second durations, and identifying the timewise location of the second greater value as the event. For example, during the period 530 the example waveform 500c has pulses with relatively short "on" times and relatively longer "off" times, and during the period 534 the example waveform 500c has pulses with relatively long "on" times and relatively shorter "off" times. This reversal of durations is represented by the point 540. At pulse #14, the sample 560 has a greater value than the sample 570, but at pulse #15 the sample 572 has a greater value than the sample 562. In some implementations, this reversal of greater and lesser values between the collection 500e and the collection 500d can be used to identify the VOT.

In some implementations, the determining done at 760 can include determining duty cycle values based on the Boolean waveform, determining a timewise location at which the duty cycle settles within a predetermined duty cycle band, and identifying the timewise location as the event. For example, the settling time of a transfer function can be measured and can be estimated as the time elapsed from start of the delivery of current to an electromagnetic actuator to the time at which the output (e.g., in this example, the differential of duty cycle), has entered and remained within a specified error band (e.g., the error band 380), which is usually symmetrical about the final value. In the example of the waveform 350 of FIG. 3B, the settling sample period 360 starts at sample=0 and lasts until approximately sample=$8.1 \times 10^4$.

In some implementations the process 700 can include identifying a start time before identifying the completion time, determining a third duration as a difference between the start time and the completion time, and providing the third duration as valve time-to-completion duration value. For example, the actuator controller 100 may identify a start time when the current represented by the example waveform 500a starts to be delivered (e.g., the time at sample zero). The actuator controller 100 can compare the difference between the start time and the VOT to determine the amount of time that the valve 22 took to open, and the actuator controller 100 can provide that value at a time-to-completion (e.g., time to open) duration value.

In some implementations, the analog electrical current waveform can be evaluated during an actuator keep-in phase and the start time can be the start of the keep-in phase. For example, the example waveform 201 of FIG. 2 can be evaluated during the hysteretic control segment 225.

In some implementations, the VOT can be applied to a mathematical model to determine alterations in the application of actuator current. For example, the VOT can be used to determine how long the example fuel injector 20 takes to open when it is signaled to do so. That length of time can be applied to a mathematical model or simulation of fuel delivery to estimate an amount of fuel delivered during an injector cycle. The estimated amount can be compared to a desired amount of fuel to determine compensating adjustments that can be made to cause future injection cycles to deliver future amounts of fuel that better approximate the desired amounts. For example, as a valve slows with age (e.g., due to wear) the start of injector cycles may be initiated earlier and/or the actuation cycle may be lengthened to ensure that a desired amount of fuel can be delivered prior to a combustion cycle.

Although a few implementations have been described in detail above, other modifications are possible. For example, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other implementations are within the scope of the following claims.

What is claimed is:

1. A method for determining actuator actuation time, comprising:
    evaluating an analog electrical current waveform;
    determining a Boolean waveform based on the evaluated analog electrical current waveform;
    determining a collection of one or more first durations based on one or more on times identified from the Boolean waveform;
    determining a collection of one or more second durations based on one or more off times identified from the Boolean waveform;
    comparing ones of the collection of first durations with timewise corresponding ones of the collection of second durations to identify a minimum difference value;
    identifying a timewise location of the minimum difference value;
    determining, based on the comparing, an event based on the identified timewise location;
    identifying a time at which the event occurred; and
    providing the time as a completion time.

2. The method of claim 1, wherein the analog electrical current waveform is in hysteresis and varies on a periodic interval across a range of values between a predetermined low current level and a predetermined high current level higher than the low current level.

3. The method of claim 1, wherein determining a Boolean waveform based on the evaluated analog electrical current waveform further comprises:
    identifying a transition from a Boolean off value to a Boolean on value in the Boolean waveform based on the analog electrical current waveform varying from a current level below a first current threshold value to a current level equal to or above the first current threshold; and
    identifying a transition from a Boolean on value to a Boolean off value in the Boolean waveform based on the analog electrical current waveform varying from a current level equal to or above a second current threshold value to a current level below the second current threshold.

4. The method of claim 1, wherein determining, based on the comparing, an event based on the comparing further comprises:
    determining a collection of first interpolated values based on an interpolation of timewise adjacent pairs of the first durations;
    determining a collection of second interpolated values based on an interpolation of timewise adjacent pairs of the second durations; and,
    determining a collection of differences between the first interpolated values and timewise corresponding ones of the second interpolated values, wherein the event is based on the collection of differences.

5. The method of claim 1, wherein the minimum difference value is zero.

6. The method of claim 1, wherein determining, based on the comparing, an event based on the comparing further comprises:
    determining a collection of differences between ones of the first durations and timewise corresponding ones of the second durations, each of the differences having a numerical sign;
    identifying a timewise location of a change in the numerical signs of timewise adjacent pairs of the collection of differences; and
    identifying the timewise location of the change in the numerical signs as the event.

7. The method of claim 1, wherein determining, based on the comparing, an event based on the comparing further comprises:
    identifying a first greater value between a selected first duration of the first durations and a second duration of the second durations that corresponds timewise to the selected first duration;
    identifying whether the first greater value was taken from the first durations or was taken from the second durations;
    identifying a second greater value between another first duration of the first durations that is timewise adjacent to the selected first duration and another second duration of the second durations that corresponds timewise to the another first duration;
    identifying whether the second greater value was taken from the first durations or was taken from the second durations;
    determining that the first greater value and the second greater value were taken from different ones of the first durations or the second durations; and
    identifying the timewise location of the second greater value as the event.

8. The method of claim 1, wherein determining, based on the comparing, an event based on the comparing further comprises:
    determining duty cycle values based on the Boolean waveform;
    determining a timewise location at which the duty cycle settles within a predetermined duty cycle band; and
    identifying the timewise location as the event.

9. The method of claim 1, further comprising:
    identifying a start time before identifying the completion time;
    determining a third duration as a difference between the start time and the completion time; and
    providing the third duration as valve time-to-completion duration value.

10. The method of claim 9, wherein the analog electrical current waveform is evaluated during an actuator keep-in phase and the start time is the start of the keep-in phase.

11. An actuator control system comprising:
    an actuator configured to transition between a first configuration and a second configuration in response to an input signal;
    a controller configured to perform operations comprising:
        evaluating an analog electrical current waveform;
        determining a Boolean waveform based on the evaluated analog electrical current waveform;
        determining a collection of one or more first durations based on one or more on times identified from the Boolean waveform;

determining a collection of one or more second durations based on one or more off times identified from the Boolean waveform;

comparing ones of the collection of first durations with timewise corresponding ones of the collection of second durations to identify a minimum difference value;

identifying a timewise location of the minimum difference value;

determining, based on the comparing, an event based on the identified timewise location;

identifying a time at which the event occurred; and providing the time as a completion time.

12. The actuator control system of claim 11, wherein the analog electrical current waveform is in hysteresis and varies on a periodic interval across a range of values between a predetermined low current level and a predetermined high current level higher than the low current level.

13. The actuator control system of claim 11, wherein determining a Boolean waveform based on the evaluated analog electrical current waveform further comprises:

identifying a transition from a Boolean off value to a Boolean on value in the Boolean waveform based on the analog electrical current waveform varying from a current level below a first current threshold value to a current level equal to or above the first current threshold; and identifying a transition from a Boolean on value to a Boolean off value in the Boolean waveform based on the analog electrical current waveform varying from a current level equal to or above a second current threshold value to a current level below the second current threshold.

14. The actuator control system of claim 11, wherein determining, based on the comparing, an event based on the comparing further comprises:

determining a collection of first interpolated values based on an interpolation of timewise adjacent pairs of the first durations;

determining a collection of second interpolated values based on an interpolation of timewise adjacent pairs of the second durations; and, determining a collection of differences between the first interpolated values and timewise corresponding ones of the second interpolated values, wherein the event is based on the collection of differences.

15. The actuator control system of claim 11, wherein the minimum difference value is zero.

16. The actuator control system of claim 11, wherein determining, based on the comparing, an event based on the comparing further comprises:

determining a collection of differences between ones of the first durations and timewise corresponding ones of the second durations, each of the differences having a numerical sign;

identifying a timewise location of a change in the numerical signs of timewise adjacent pairs of the collection of differences; and identifying the timewise location of the change in the numerical signs as the event.

17. The actuator control system of claim 11, wherein determining, based on the comparing, an event based on the comparing further comprises:

identifying a first greater value between a selected first duration of the first durations and a second duration of the second durations that corresponds timewise to the selected first duration;

identifying whether the first greater value was taken from the first durations or was taken from the second durations;

identifying a second greater value between another first duration of the first durations that is timewise adjacent to the selected first duration and another second duration of the second durations that corresponds timewise to the another first duration;

identifying whether the second greater value was taken from the first durations or was taken from the second durations;

determining that the first greater value and the second greater value were taken from different ones of the first durations or the second durations; and identifying the timewise location of the second greater value as the event.

18. The actuator control system of claim 11, wherein determining, based on the comparing, an event based on the comparing further comprises:

determining duty cycle values based on the Boolean waveform;

determining a timewise location at which the duty cycle settles within a predetermined duty cycle band; and identifying the timewise location as the event.

19. The actuator control system of claim 11, the operations further comprising:

identifying a start time before identifying the completion time;

determining a third duration as a difference between the start time and the completion time; and providing the third duration as valve time-to-completion duration value.

20. The actuator control system of claim 19, wherein the analog electrical current waveform is evaluated during an actuator keep-in phase and the start time is the start of the keep-in phase.

* * * * *